United States Patent
Krishnapillai

(10) Patent No.: US 7,552,032 B2
(45) Date of Patent: Jun. 23, 2009

(54) METHOD AND SYSTEM FOR AUTOMATED DESIGN

(75) Inventor: Anandasivam Krishnapillai, Singapore (SG)

(73) Assignee: National University of Singapore, Singapore (SG)

( * ) Notice: Subject to any disclaimer, the term of this patent is extended or adjusted under 35 U.S.C. 154(b) by 45 days.

(21) Appl. No.: 11/241,204

(22) Filed: Sep. 30, 2005

(65) Prior Publication Data
US 2007/0078634 A1    Apr. 5, 2007

(51) Int. Cl.
*G06F 17/50*    (2006.01)
(52) U.S. Cl. .................................. 703/1; 703/2; 703/6
(58) Field of Classification Search .............. 703/1, 703/2, 6; 716/1, 4, 5; 717/105; 235/462.01
See application file for complete search history.

(56) References Cited

U.S. PATENT DOCUMENTS

| | | | |
|---|---|---|---|
| 2002/0152057 A1* | 10/2002 | Wang et al. | 703/6 |
| 2003/0213846 A1* | 11/2003 | Knowles et al. | 235/462.01 |
| 2004/0128117 A1* | 7/2004 | Crandall et al. | 703/2 |
| 2005/0028133 A1* | 2/2005 | Ananth et al. | 717/105 |
| 2005/0038636 A1* | 2/2005 | Wakelam et al. | 703/1 |
| 2005/0125204 A1* | 6/2005 | Garcia et al. | 703/1 |
| 2006/0004548 A1* | 1/2006 | Santos et al. | 703/1 |
| 2006/0020432 A1* | 1/2006 | Gower | 703/1 |
| 2006/0225003 A1* | 10/2006 | Agogino et al. | 716/1 |

OTHER PUBLICATIONS

Cau et al.; "Evaluation of a 3D shape grammer implementation"; *Design, Computing and Cognition '04*; 357-376; 2004.
Garza et al.; "A cognitive evaluation of a computer system for generating mondrian-like art work"; *Design, Computing and Cognition '04*; 79-96; 2004.
Gu et al.; "Formulation of aesthetic evaluation and selection"; *Design, Computing and Cognition '04*; 337-353, 2004.

\* cited by examiner

*Primary Examiner*—Paul L Radriguez
*Assistant Examiner*—Kandasamy Thangavelu
(74) *Attorney, Agent, or Firm*—Patton Boggs LLP

(57) ABSTRACT

A method and system for automated design of an object. The method comprises providing a default model of the object; extracting design parameters and their respective values from the default model; assigning generated values to one or more selected ones of the design parameters; and generating one or more designs, each design corresponding to respective sets of generated values for said selected design parameters.

32 Claims, 15 Drawing Sheets

Figure 6

METHOD AND SYSTEM FOR AUTOMATED DESIGN

BACKGROUND OF THE INVENTION

1. Field of the Invention

The present invention relates broadly to a method and system for automated design, and to a data storage medium having stored thereon computer code means for instructing a computer to execute a method of automated design.

2. Description of Related Art

Over recent years, an extensive amount of research has been devoted to investigating computer generated or computer assisted design. However, compared with the substantive research efforts, there have been very few actual computer implementations presented, and to the applicant's knowledge no commercially available computer implementation product can currently be found in the market place. As an indication of this lack of successful implementation, it is noted that, for example, at the Massachusetts Institute of Technology (MIT) Conference *Design, Computing and Cognition '04* in July 2004, a small number of relatively limited demonstration programs were presented. It was noted during the conference that in spite of substantive research efforts, the impact of the research on actual designing practice has been low and it is arguably the lack of successful computer implementation that has led to the low impact.

The above-mentioned research can be classified as "generative design" and is related to three broad design-type categories, namely "shape grammar", "genetic algorithms", and "computational aesthetics". One example of work in the area of shape grammar is Hau Hing Cau et al., "Evaluation of a 3D shape grammar implementation", *Design, Computing and Cognition '04*, 357-376, 2004. Examples of work in the area of computational aesthetics are Zhen Yu Gu et al., "Formulation of aesthetic evaluation and selection", *Design, Computing and Cognition '04*, 337-353, and Andres Gomez De Silva Garza et al., "A cognitive evaluation of a computer system for generating mondrian-like art work", *Design, Computing and Cognition '04*, 79-96.

Research in the shape grammar field focuses on architectural and engineering shape computation as a formal approach for supporting style conformance. Shape grammar is centered around providing basic elements typically with predefined parameters, and providing rules that govern the relationship between design elements. The rules are complex and there is no established way to-date of deriving these rules. The complexity of the rules increases with the complexity of each design—making this method difficult to implement, in particular in a context where the designers explore a wide variety of design options before selecting the final form.

Research in genetic algorithms involves providing an initial or seeding population of designs, breeding from the initial population, the breeding comprising mutation and design cross-mixing resulting in crossing of genes, for creating an expanded population. Manual or algorithmic selection is then performed on the expanded population to either arrive at a new initial population or a final solution.

Finally, work in computational aesthetics centers around models or algorithms to "codify" what constitutes human aesthetic fitness evaluation, with the aim of automating selection and/or evaluation in computer design.

A common feature of typical design generation methods is that they involve setting up complex computer algorithms for each particular design problem making the methods unsuitable for practical applications in design.

Hence, there exists a need to provide a method or system to address one or more of the above problems.

SUMMARY OF THE INVENTION

In accordance with a first aspect of the present invention there is provided a method of automated design of an object, the method comprising providing a default model of the object; extracting design parameters and their respective values from the default model; assigning generated values to one or more selected ones of the design parameters; and generating one or more designs, each design corresponding to respective sets of generated values for said selected design parameters.

In accordance with a second aspect of the present invention there is provided a system for automated design of an object, the system comprising means for extracting design parameters and their respective values from a default model; means for assigning random values to one or more selected ones of the design parameters; and means for generating one or more designs, each design corresponding to respective sets of random values for said selected design parameters.

In accordance with a third aspect of the present invention there is provided a system for automated design of an object, the system comprising an extractor for extracting design parameters and their respective values from a default model; a processor for assigning random values to one or more selected ones of the design parameters; and a generator for generating one or more designs, each design corresponding to respective sets of random values for said selected design parameters.

In accordance with a fourth aspect of the present invention there is provided a data storage medium having stored thereon computer code means for instructing a computer to execute a method of automated design of an object, the method comprising providing a default model of the object; extracting design parameters and their respective values from the default model; assigning random values to one or more selected ones of the design parameters; and generating one or more designs, each design corresponding to respective sets of random values for said selected design parameters.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 6 is a screenshot of a design table in an example embodiment.

DETAILED DESCRIPTION OF THE PRESENT INVENTION

The example embodiment described has been implemented utilizing an existing Parametric Computer Aided Design (CAD) package, more particularly a SolidWorks® package. However, it will be appreciated by a person skilled in the art that the present invention is not limited to implementation in the SolidWorks® package, but may be implemented using different existing parametric CAD application programs or in a wholly proprietary application program.

In the example embodiment, a computer implementation is provided for a design technique where feasible design solutions are derived from user-defined preferences and geometric limitations, based on an initial default model. The feasible design solutions are then further selected and/or modified, based on exploration strategies related to user-defined parameter selections. The exploration strategies comprise selecting parameter values within a design space such that a region of values for geometrically viable designs is established.

In the example embodiment, in relation to the computer implementation, designs are generated using a Design Generation Program which operates on the Default Model built in the Parametric CAD package. A Design Table is used to list the Design Parameters of the generated designs. The information in this table may be stored in an Array in the computer's memory. The variable Design Parameters are values that are used in the example embodiment to create variations of the default model. The variable Design Parameters comprise a selected number of all the design parameters which define the original default model. In the example embodiment, the design parameters comprise geometric parameters, color texture and others.

The derivation of design solutions and exploration strategies in the example embodiments are described with reference to FIGS. 1 and 2, respectively.

Figure 1:
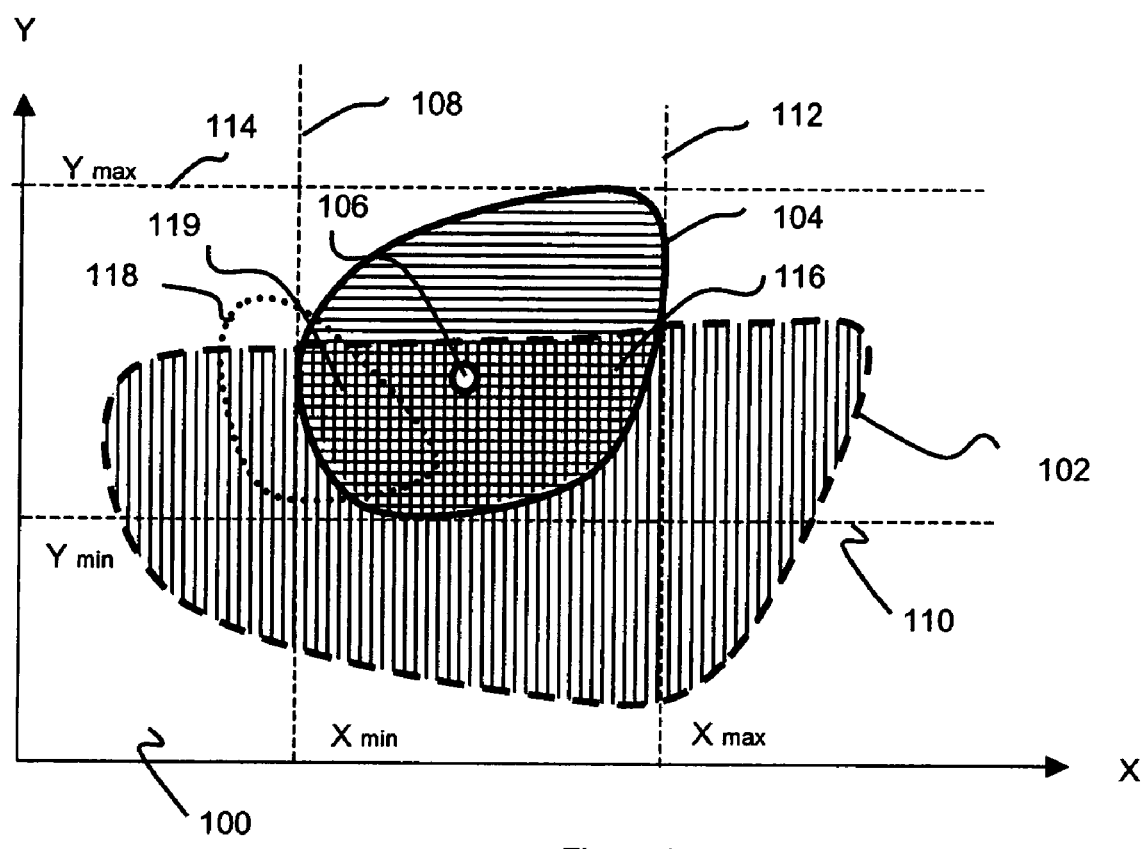
FIG. 1 shows a two-dimensional representation of mapping two-parameter design configurations in regions of a design space in an example embodiment.

FIG. 1 illustrates a two-dimensional design space 100 of a design to be generated with two variables denotes as x and y in the example embodiment. It has since been recognized that typical designs having more variables can be represented similarly in a multi-dimensional design space. In the example embodiment, a design problem with two design variables and each design solution can be represented as a point such as 106 in the two-dimensional design space 100. In the example embodiment, design possibilities are represented as regions 102 and 104. Given the available x and y values, the CAD package can generate a geometric representation of each design possibility. Region 102 defines a region of design space 100 that is geometrically viable for all design possibilities. The design possibilities outside region 102 are not geometrically viable. In the example embodiment, when the CAD program tries to construct a design representation outside the region 102, the CAD program generates an error message indicating that the geometry of the proposed design possibility is unviable. The CAD program may generate such an error message if the program is not able to construct the geometry due to limitations native to the CAD program or due to the geometrical infeasibility of the proposed design.

For example, the default model will be constructed within the CAD model with certain geometric relationships which are established using the native functions of the CAD program when the default model is constructed. The x and y values (FIG. 1) are used to drive the default model, and additional pre-built relationships can be established when the model is being built.

In the example embodiment, region 104 represents a region of design possibilities that a user desires. The user may desire a number of design possibilities that are not geometrically viable due to e.g. the lack of understanding of the behavior of the default design in the design space 100 or due to the inability of the CAD program to generate the designs in the desired region. The default model 106 represented by a point P(x,y) is substantially disposed in the center of the user-desired region 104 as the user bases the parameter variations and preferences on the default model 106. The default model is built in the CAD program using its native functions. Certain geometric relationships are established to keep the default model stable when its proportions are changed. The proportions of the default model are driven by certain values x and y in this example. The choice of dimensioning of the model determines the way the model will vary, as the dimensions y are the means of controlling the geometry of the design once the default model is built. The same default model will exhibit different types of variations if different points are chosen for dimensioning the model. The user can build the default model in the CAD program and dimension it such that changes in those dimensions lead to desirable design outcomes.

In the example embodiment, the designer can set initial limits for the maximum and minimum values of x and y to start the automated design generation process. As illustrated in FIG. 1, the minimum x and y values are represented along axes 108 and 110, respectively, while the maximum x and y values are represented along axes 112 and 114, respectively. The axes 108, 110, 112 and 114 define the region of design exploration in the example embodiment. Based on the defined boundaries, the package in the example embodiment identifies the intersection region 116 of the regions 102 and 104. The intersection region 116 thus defines the geometrically viable and user-desired design possibilities that can be generated. The region denoted by 118 may be region of interest due to additional considerations such as cost, manufacturability, etc. Hence, it is possible to limit the design exploration to an even smaller intersecting region 119 if additional constraints are employed to constrict the design search space in example embodiments.

Figure 2:
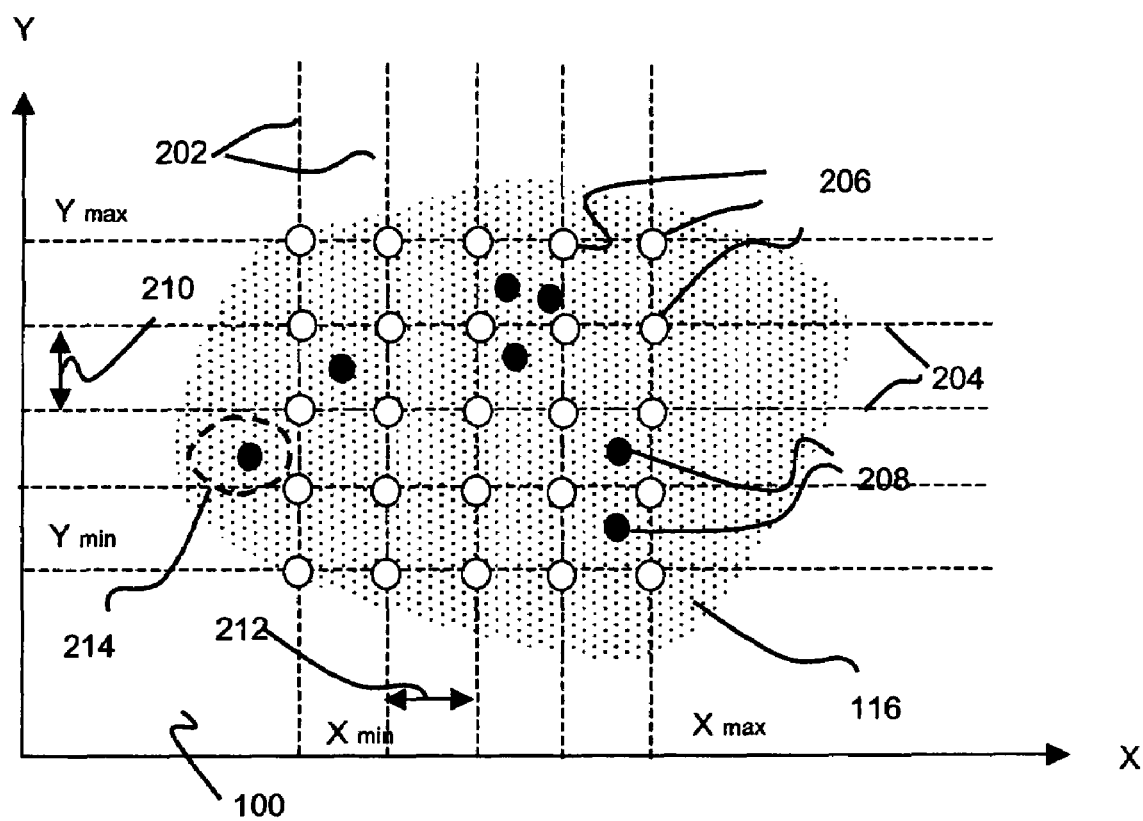
FIG. 2 is an illustration showing exploration strategies and mapping of design solutions in an example embodiment.

FIG. 2 illustrates automated exploration of design possibilities to be generated with x and y variables within the intersection region 116 in the example embodiment. In the example embodiment, two types of exploration strategies are possible. A first strategy is a structure search which can be carried out on a equally spaced defined grid while a second strategy is an unstructured search using random numbers generated based on the user preferences. Using the first strategy, the design possibilities can be explored in a grid defined by axes (e.g. 202, 204) and the design possibilities are denoted by points (e.g. 206). Using the second strategy, the design possibilities are randomly explored/generated in the region 116 and are denoted by points (e.g. 208). When utilizing the first strategy, the grid spacings 210 and 212 can be varied depending on the user-defined number of solutions that are to be explored. Using the second strategy, regions (e.g. 214) around design possibilities 208 can be defined and can be used to detect solutions that are substantially similar to each other.

During exploration using either of the strategies, the distance between solutions represented by points e.g. 206, 208 can be controlled based on the user-defined number of solutions to be explored. In a sequential display of designs, a first set is chosen with the distance between solutions as far as possible to generate a diverse set of designs. If more solutions are desired, the distance can be reduced.

In the example embodiment, the above technique allows more diverse solutions to be presented at the beginning of the initial generation process and less diverse solutions to be presented as the exploration progresses. In the example embodiment, the design exploration can be carried out in the design parameter space 100 or it can be carried out in another space, such as a performance space that is a function of the parameter space. In such an instance, the parameter space 100 is mathematically mapped to the performance space. An exploration in the performance space can create design solutions that are spaced out according to a chosen criteria. For example, a mapped performance space for color made up of design parameters RGB (Red Component, Green Component, Blue Component) may be, for example, the Commission Interternationale de l'Eclairage (CIE) L*a*b* Colour Space which is created according to human perception of color. Equal spacing when exploring in the CIE L*a*b* Space can result in equal perceptual differences, whereas equal spacing exploration in the Red, Green, Blue components-parameter design space may not create equal differences from a perceptive point of view. Another example is that of a user who may wish to explore designs that are differentiated by volume, rather than x and y values. Such a method allows the user to explore design possibilities in a way that the design possibilities are suitably spaced based on one or more selection criteria that they may choose to use.

Figure 3:
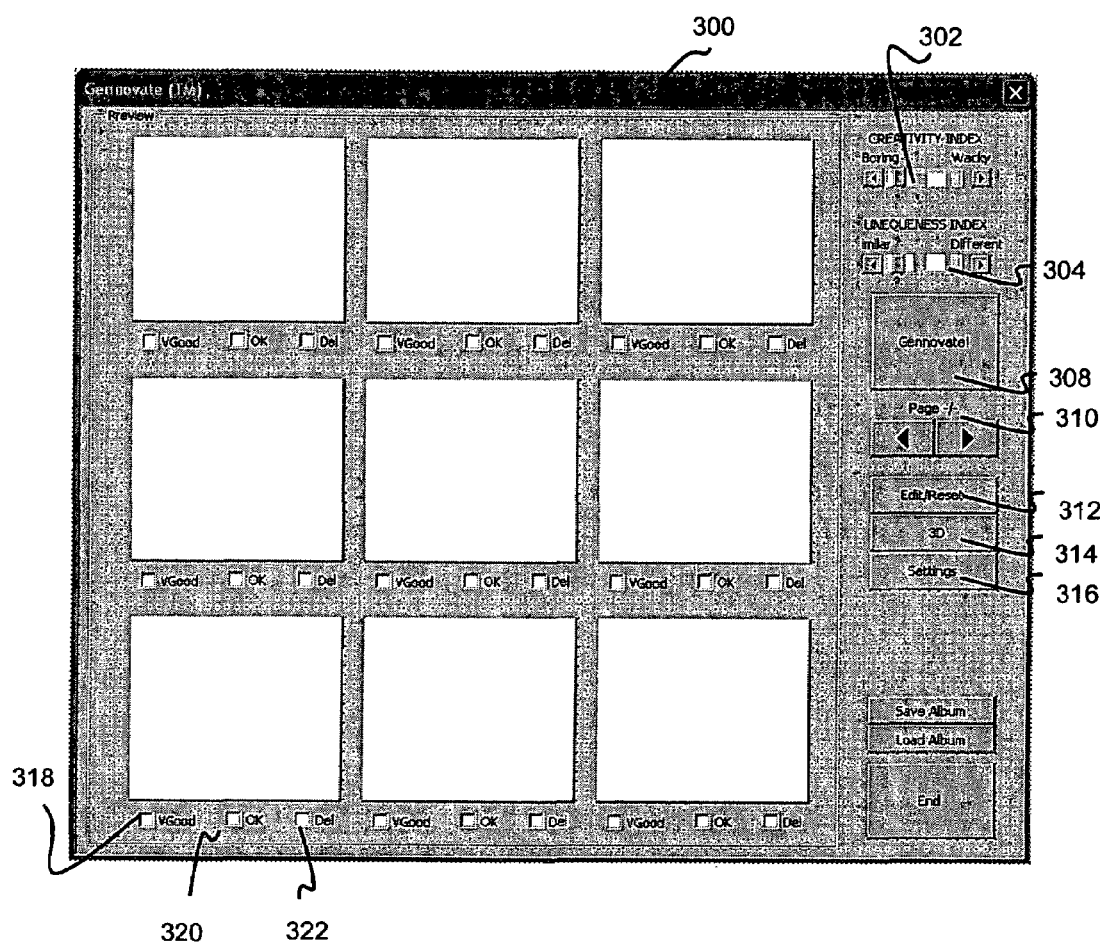
FIG. 3 is a screenshot of a user interface that allows the user to generate design variations in an example embodiment.

FIG. 3 is a screenshot of a user interface 300 that allows the user to generate design variations in the example embodiment. A Creativity Index scrollbar 302 may provide for the user to indicate the level of desired diversity (in relation to the default model) in the design solutions to be generated. A Uniqueness Index scrollbar 304 can be used to vary the coverage of the region 214 (FIG. 2) to ensure that the design solutions that are considered are sufficiently distanced from each other. It should be understood that any other graphical input device, such as a text box, knob, or otherwise, as understood in the art may be utilized to enable a user to set or adjust the different indexes. A Gennovate button 308 is provided and can be pressed to start the design generation process. Switch 310 is provided for the user to view more design options when available. Switch 312 is provided for the user to access the 3D (three-dimensional) CAD package to e.g. edit a selected generated design or to reset the limits of exploration. Button 314 is provided for the user to display the selected design in an interactive 3D format, such as eDrawings format for interactive web based display of the designs. Button 316 is provided for the user to set other generative and design parameters. In the example embodiment, after design solutions are generated, the user can indicate user preference of each design solution by selecting one of the buttons 318 (for "very good"), 320 ("okay") and 322 ("delete"). The buttons 318, 320 and 322 can be used to select or rank the generated design solutions.

In the example embodiment, the limit within which each design solution is allowed to vary is called a "Creativity Index". The Creativity Index, taking the value of the Creativity Index scrollbar 302, is a numerical parameter that controls the geometric limits of variations. The limits may be set directly on the design parameters or may be set in a performance space that is, for example, directly mappable to the design space. For example, a qualitative measure of "bulge" may be imposed on design parameters. The creativity index can be set to control the "bulge", based on a user-defined numerical factor. The creativity index may be set feature by feature. In the example embodiment, the creativity index operates directly in the set limits for the whole of a design or selected design variables or features of the design.

In the example embodiment, the Uniqueness Index scrollbar 304 relates to a "uniqueness factor" that can be imposed on the design parameters to be set in the performance space that is mapped directly to the design space comprising a set of design parameters. The uniqueness factor can also be set feature by feature. The uniqueness measure in the example embodiment is associated with an absolute difference in all the varied parameters between each output computer generated design.

In the example embodiment, the Design Generation Program resides in a Design Generation System. The Design Generation System comprises four components:
  1. Parametric CAD Package
  2. Design Model that can be manipulated in the Parametric CAD Package
  3. Design Generation Program
  4. Design Table The parametric CAD package has a representation of the design parameters that are used to define each default model or a collection of default models.

Figure 4:
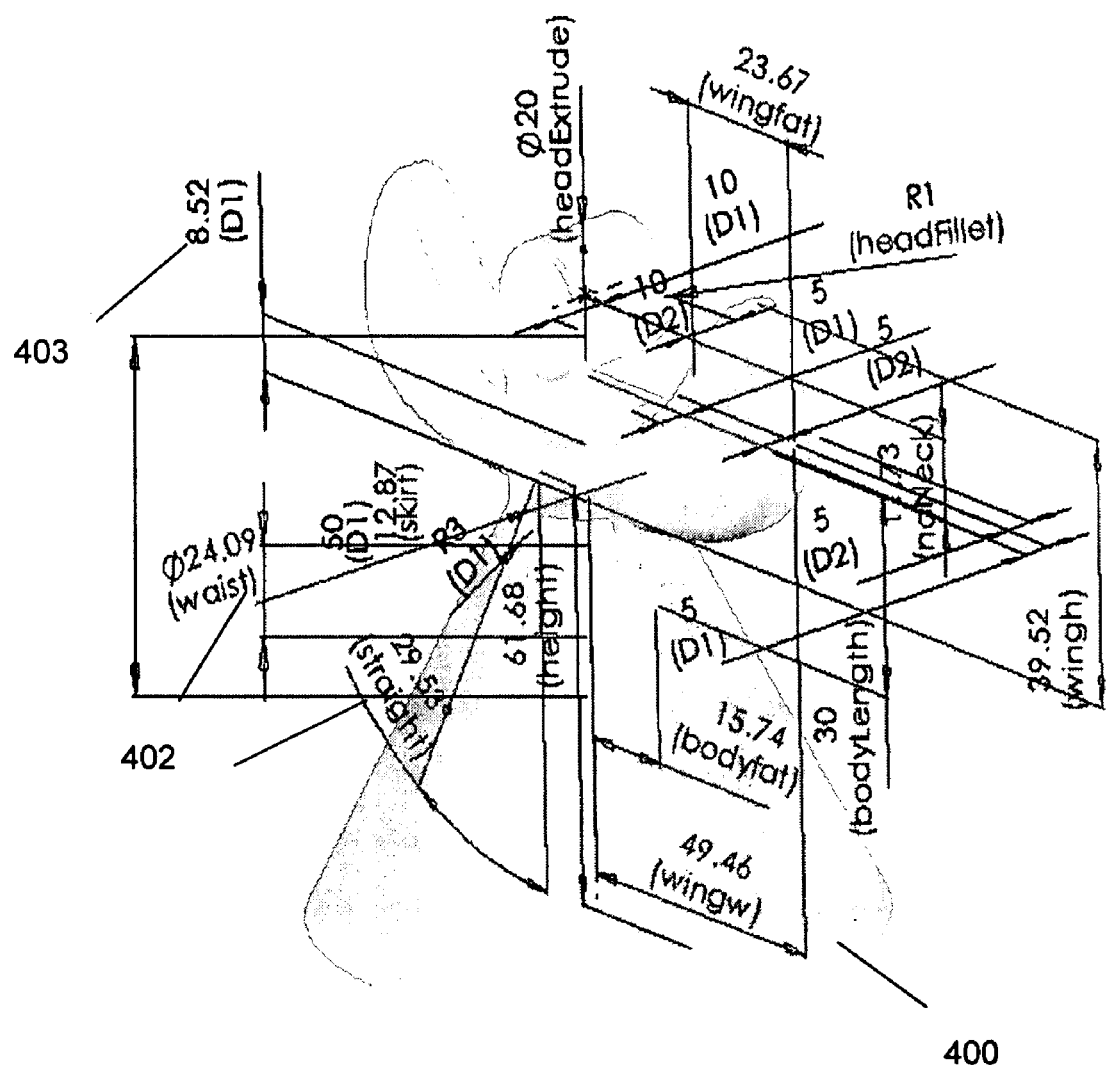
FIG. 4 is a schematic perspective view of a default model selected by a user in an example embodiment.

The Design Generation Program comprises four software components as follows:
  1. Parameter Extraction Program
  2. Limit Generation Program
  3. Design Configuration Program
  4. Design Selection Program The Design Generation Program has user interfaces that connect to one or more of the software components. The user interface may include conventional screen based interfaces, may be based on customized hardware, or a combination of both. The Parameter Extraction Program module within the Design Generation Program "interrogates" the CAD package of the System for selecting design parameters that can be varied. These design parameters may then be placed in the design table of the System. The Design Generation Program has an interface that allows the user to select design parameters to be varied as not all the design parameters need to be varied, depending on the user preferences. Alternatively, a renaming scheme may be used in dimensioning a Default Design within the CAD package, where the user can indicate a design parameter to be varied by changing the default name of the design parameter. For example, a default design parameter having a default name "D1@plane1" may be renamed as "Length@plane1" allowing the Design Generation Program to detect the change in default name, indicating that this design parameter has been chosen by the user for further variations in parameter value. Such a scheme is illustrated in FIG. 4 where some of the default dimensioning names are renamed, for example, 402, whereas others are maintained, for example, 403.

In the example embodiment, the design process comprises of setting up the default model in a CAD package, building the default model's geometric logic using the native functions of the CAD package and placing dimensions judiciously to enable the desirable variations of the design by means of varying these dimensions at a latter stage. The dimensional values representing the design parameters of the default model are set in a way that the increase and decrease of these dimensions create desirable design outcomes. The range and extent to which the default values are altered are also set parameter by parameter or by using an overall creativity index.

The user of the Design Generation System can first explore a number of relatively highly distinctive generated designs and then selecting from the generated designs, a smaller number of desired designs and then further exploring the desired designs to a relatively greater detail.

Default Model

FIG. 4 is a schematic perspective view of the default model selected the user in the example embodiment. The default model 400 is built in the Parametric CAD Package such that the geometric logic of the default model is logically structured by using the internal functions of the CAD program. The geometry of the default model remains stable in the example embodiment as the geometry is varied by changing the parameter values that define the initial default model. Most CAD packages are based on geometric kernels that allow geometric models to be built with relationships between geometric entities. For example, a line could be defined to be tangent to a circle or two lines can be made to remain parallel to each other. The initial creation of the default model 400 is based on identifying fundamental or common features/parameters of a variety of existing designs. The default model "embodies" in generic form the possible desirable variations. A study of desirable outcomes may be useful in constructing the default model. Dimensions are placed in the default model so that by altering those dimensions all the desired variations may be created. The parameters (e.g. 402) that can be subjected to change are identified in the default model. In the example embodiment, identification is done by changing the default names of the dimensions so that the Design Generation Program can recognize the name changes (default naming in Solid Works will give dimension names such as D1, as at numeral 403) and can use the name changes to identify the parameters e.g. 402 that can be varied. The above naming convention may also be used to e.g. indicate on an approximate basis, the size of the desired variations from the default values by adding, for example, an L (for Large), an M (for Medium) and an S (for Small) during the name changes. The variations may be used when exploring design possibilities as described previously with reference to FIG. 2.

Engineering and manufacturing constraints may be incorporated into the default model by appropriate dimensioning. For example, by dimensioning the external shell of a TV from the limits of the internal components such as a CRT tube, it is possible to ensure a controllable gap between the two. Such a modeling method can ensure the external shell of a design will encase its internal components. Manufacturing issues also present geometric limitations, which can be incorporated into the default model. For example, plastic molding requires minimal draft angles which are required to ensure that the part can be removed from the mold. By structuring the default model in a way such that the design is generated based on these critical angles, it can be possible to ensure that the design is within the manufacturing limits.

Parameter Extraction

Figure 5:
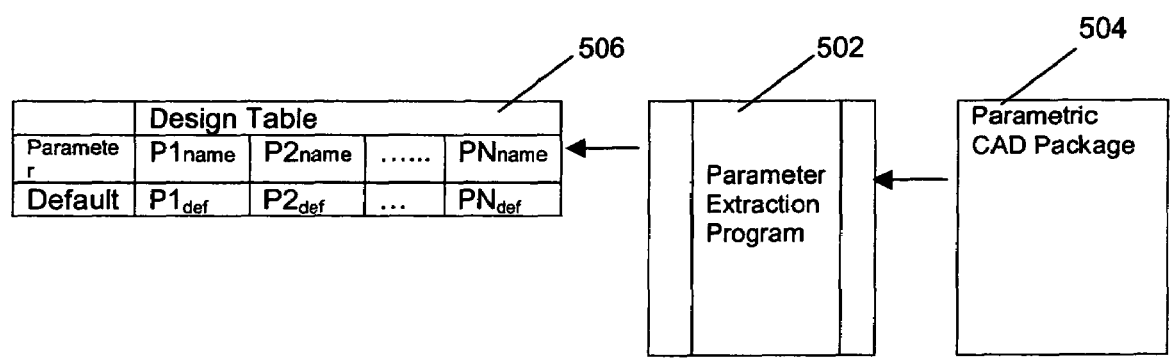
FIG. 5 is a schematic block diagram illustrating a process of parameter extraction in an example embodiment.

FIG. 5 is a schematic block diagram illustrating the process of parameter extraction in the example embodiment. Parameter Extraction Program 502 extracts the design parameters from the default model 400 (FIG. 4) by communicating with Parametric CAD Package 504. The extracted design parameters that can be used for generating the design variations based on the default model 400 (FIG. 4) are chosen and placed in design table 506.

Figure 6:
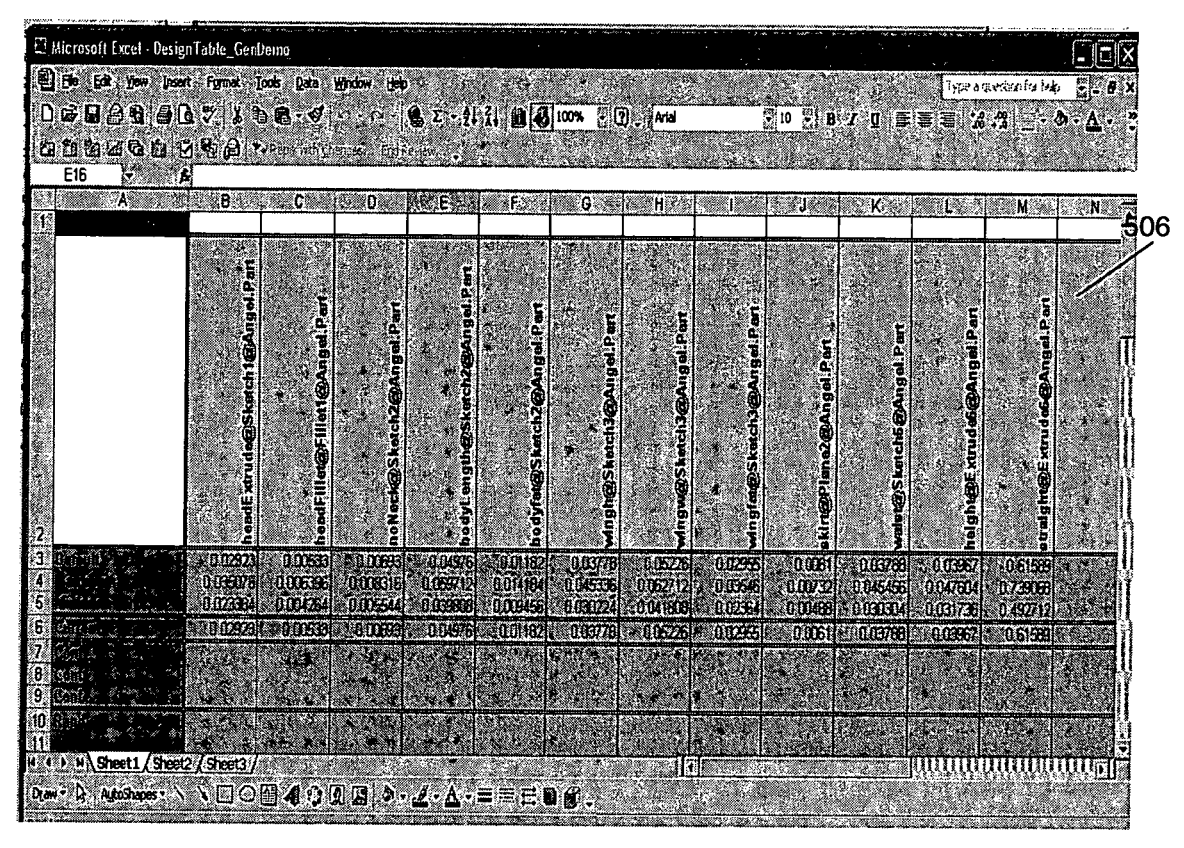

FIG. 6 is a screenshot of the design table 506 in the example embodiment. The design parameters may also be grouped according to the features of the default model, where the model is made up of a combination of features. In an assembly that constitutes multiple parts, assembly parameters e.g. distance between parts, may also be employed as design variables. Color and texture may also be treated as Design Parameters.

Limit Generation

Figure 7:
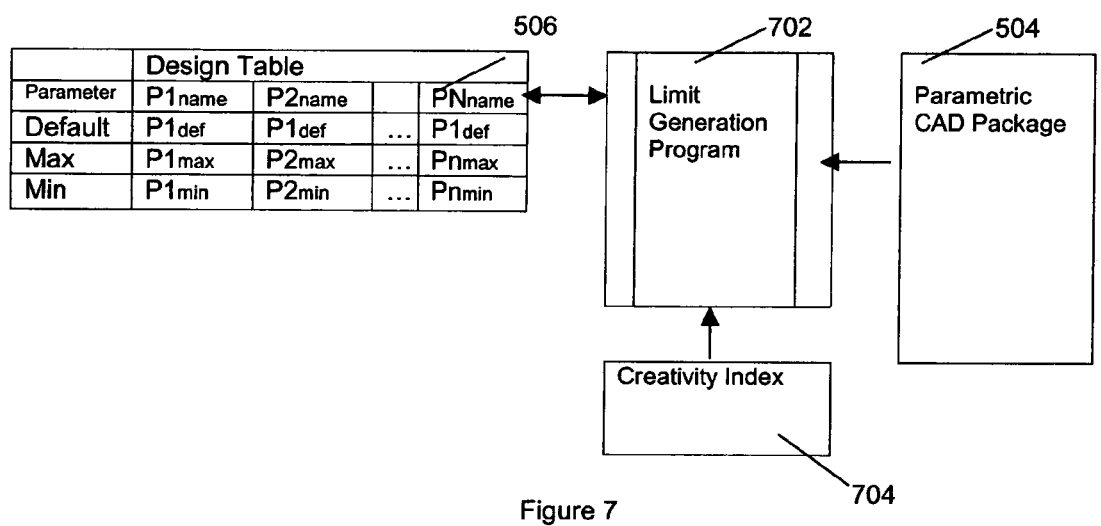
FIG. 7 is a schematic block diagram illustrating a process of limit generation in an example embodiment.

FIG. 7 is a schematic block diagram illustrating the process of limit generation in the example embodiment. The numerical limits of each design parameter in the design table 506 can be set using Limit Generation Program 702 by utilizing Creativity Index 704. In one embodiment, the value of the Creativity Index 704 is obtained by reading the value of the Creativity Index scrollbar 302 (FIG. 3). The Creativity Index 704 can be set as a percentage value e.g. 10%, which can be used to vary each parameter value between a minimum value of 90% and a maximum value of 110%, of the default value.

In the example embodiment, the Limit Generation Program 702 can also set the numerical limits for each design parameter in other ways. The numerical values can be, for example, entered directly into the design table 506 or the Limit Generation Program 702 can, for example, query the user to enter the limit values, parameter-by-parameter. This may be implemented by all dimensions first being hidden (or set to dull color) and the relevant dimensions being displayed (or set to another color) sequentially indicating the relevant parameter to the user, enabling the user to set the limits sequentially. Animation features that animate the geometry of the design indicating both the configurations with maximum value and the minimum value may also be used to help set the geometric limits.

Generation of Designs

Figure 8:
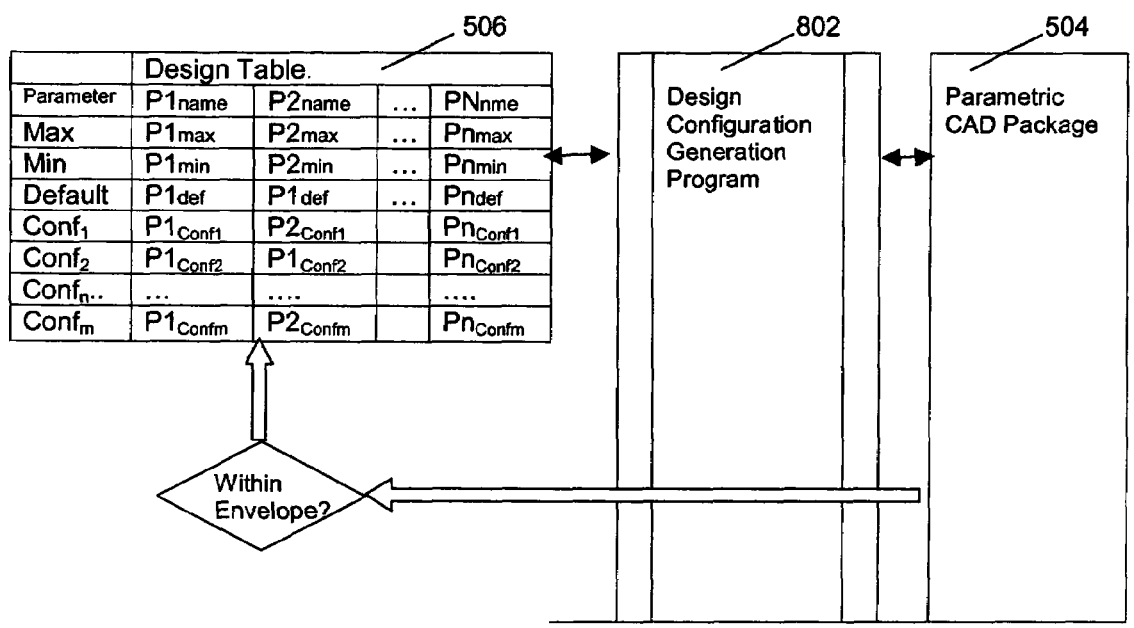
FIG. 8 is a schematic block diagram illustrating a process of generating designs in an example embodiment.

FIG. 8 is a schematic block diagram illustrating an exemplary process for generating designs in the example embodiment. After limit generation as described with reference to FIG. 7, Design Configuration Generation Program 802 next proposes varied design parameter values within the ranges set by the Limit Generation Program 702 (FIG. 7), by either of the exploration strategies as described above with reference to FIG. 2. The CAD package 804 uses these proposed parameter values to construct a three-dimensional model of each design and validates each design. Validation is to check that the design solutions are within the geometrically viable region 102 (FIG. 1). If the designs are within the envelope as defined by the region 102 (FIG. 1), the variable design parameters of the successfully generated designs are then entered into the design table 506 to create viable design configurations. The newly entered parameter values are denoted by $P1_{Confi}$ to $Pn_{Confm}$.

In the example embodiment, if a proposed model fails during processing by the CAD package 504, due to geometric errors, the design values of the failed model are noted by the CAD package 504 and stored in memory so that the Design Configuration Generation Program 802 can develop an understanding of the geometrically viable region 102 (FIG. 1). In the example embodiment, proposed designs may fail to generate due to geometric inconsistencies arising from minor errors e.g. small fillets. The Design Configuration Generation Program 802 has the capacity to evaluate the seriousness of the errors and to switch off variation of certain features which are of low importance that are causing the errors to generate a successful design. The Design Configuration Generation Program 802 can also record the errors, feature by feature, to gather a better understanding of the geometric limits of each feature. This error feature information can be used to reset the parameter limits. Therefore, in addition to the limits set at the onset for design exploration, model re-build failures are also used to establish the regions of acceptable solutions.

In the example embodiment, the Design Configuration Generation Program 802 may use the above understanding to prevent creation of design solutions near the periphery of region 102 as values near this region are more likely to fail due to geometrical errors. The Design Configuration Generation Program 802 can also use other databases or programs to take into account various design issues and design envelopes, such as region 118, before proposing parameter variations for design generation by the CAD package 504.

Design Selection

Figure 9:
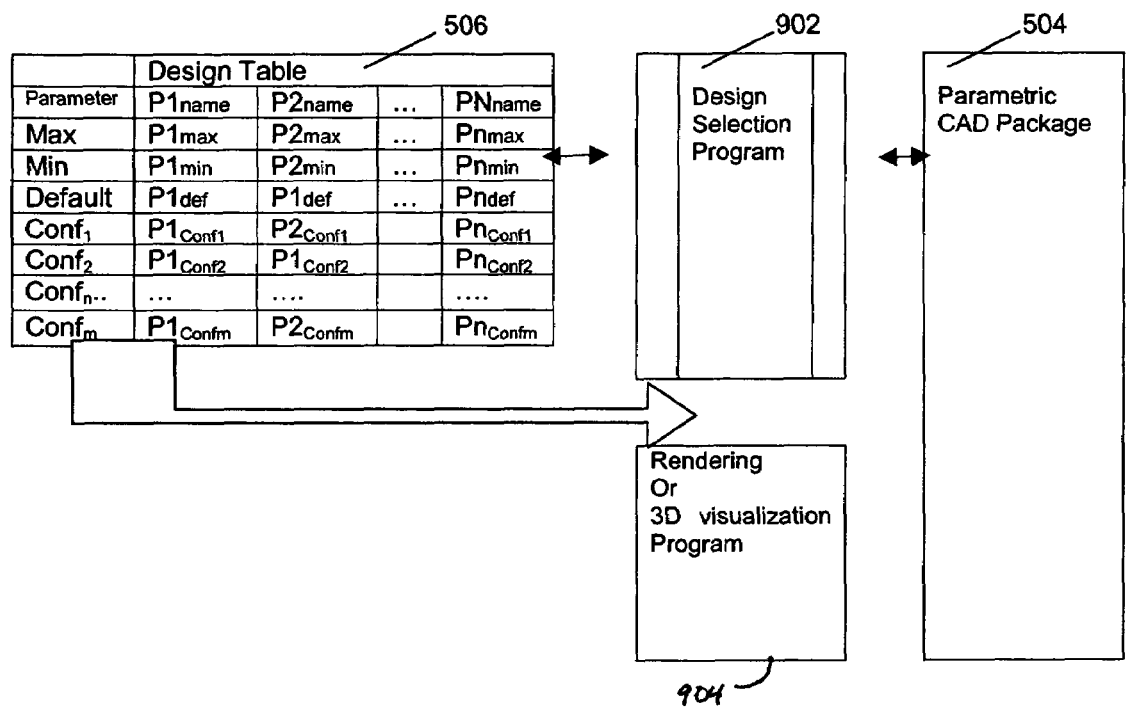
FIG. 9 is a schematic block diagram illustrating a process of design selection in an example embodiment.

FIG. 9 is a schematic block diagram illustrating an exemplary process for design selection in the example embodiment. Following the generation of designs as described with reference to FIG. 8, the Design Selection Program 902 is used by the user to select e.g. the most desirable solutions or created models. The solutions may be rendered or viewed in a three-dimensional display 904 for the user to gain a better understanding of each solution and to evaluate the designs on a closer basis.

Each successfully generated model rebuilds itself within the CAD package 504, thus allowing the user to visually judge the validity of the parameter ranges that were set using the Limit Generation Program 702 (FIG. 7).

The Design Selection Program 902 can select the desired designs by a number of ways besides user interaction. The program can select desired designs by using numerical criteria or by using restrictive design envelopes to reduce the number of solutions for further processing. The chosen designs are then used by the parametric CAD package 504 to create geometric models using e.g. a separate or built-in rendering or 3D visualization program. Realistic or interactive images of the design variants can thus be created by the parametric CAD package 504. Additional design parameters, such as color and texture, may be introduced by the user to the 3D models at this stage. Other 3D Virtual Reality Modeling Language (VRML) or Virtual Reality display techniques may also be used to display the images. Such a facility can enable market surveys through which a wide range of designs may be assessed. The design selection program can also be implemented through a network allowing users to choose, generate or modify designs using the Design Generation Program.

The entire spectrum of design possibilities may be pre-generated and stored in memory to be retrieved at the request of the user according to set criteria. Once the viable limits are established it would be possible to ensure that a user selects only designs that are viable.

In the example embodiment, selection of the desired designs may also be computer-assisted where additional numerical formula can be implemented into the Parametric CAD Package 504 (FIG. 5) to e.g. assign weights to the generated designs so that the most suitable designs can be retained for further processing.

In the example embodiment, after the selection of initial successfully generated designs, the user can proceed to adjust or reset the Creativity Index 704 (FIG. 7) which is the percentage value that determined the initial envelope within which the parametric values were altered and can be further manipulated.

Returning to FIG. 3, the user can use the Creativity Index scrollbar 302 to "weigh" the computer generation of the designs between two extremes, referred to as "boring" (i.e. of low creativity), and "wacky" (i.e. of high creativity). In the example embodiment, a creativity measure (related to the Creativity Index 704 (FIG. 7)) is associated with the limits of variations of all parameters selected to be varied. For the "boring" extreme, a smallest range is set, for example, plus minus 30% around the value of each parameter in the default model 400 (FIG. 4) in the example embodiment. For the highest creativity extreme (i.e. "wacky"), the range is set to plus minus 100% around the value of each parameter in the default model 400 (FIG. 4) in another example embodiment.

In the example embodiment, designs are generated by utilizing parametric values between the exploration limits based on the Creativity Index 704 (FIG. 7). If the Creativity Index scrollbar 302 is set to, for example, 100% (i.e. "wacky"), the Design Configuration Generation Program 802 can generate design parameters within the full range set by the exploration limits. If the Creativity Index scrollbar 302 is set at, for example, (30%) (i.e. closer to "boring"), then the maximum value of the design parameters is at 30% of each exploration limit. In the example embodiment, the design values may be set by either using a random function to generate values within two limits or by using a structured approach where values are generated in equal interval steps to explore the design space 100 (FIG. 2). The exploration approaches were described above with reference to FIG. 2.

Figure 10:
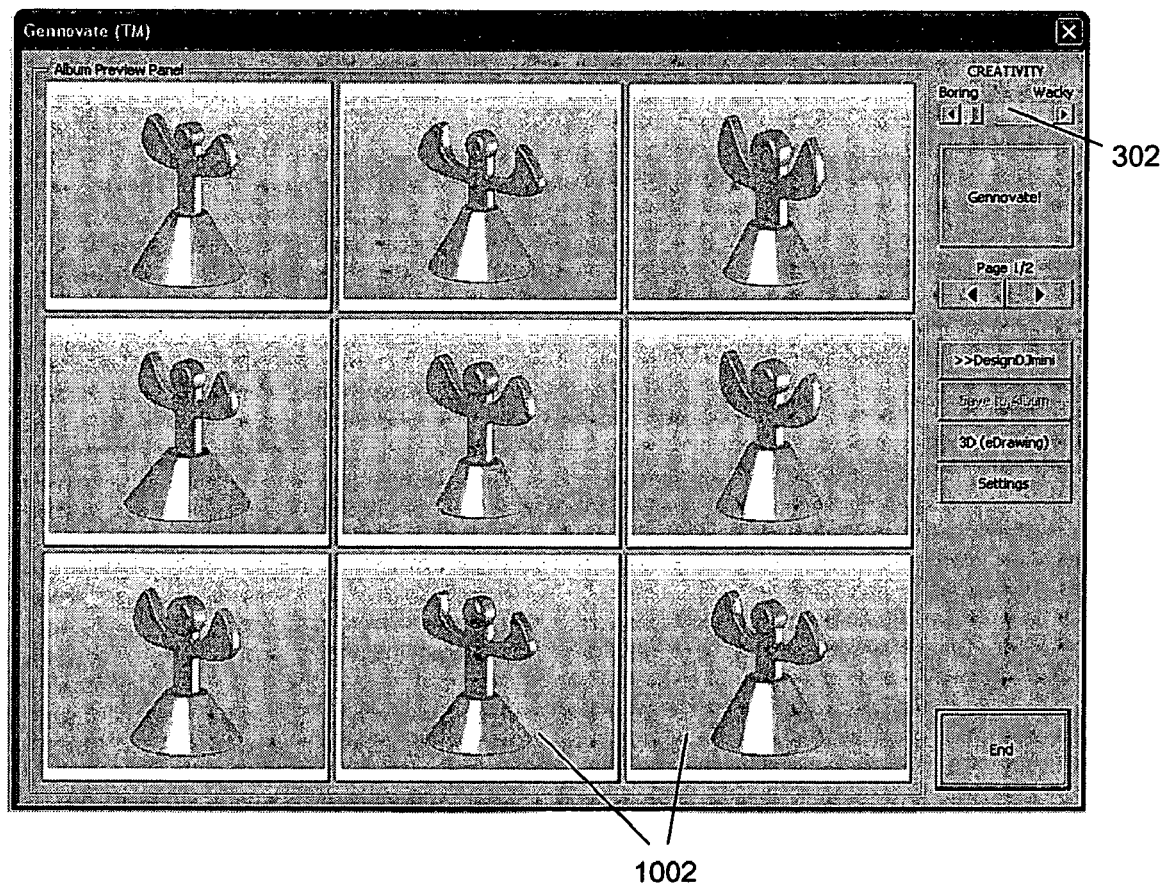
FIG. 10 is a screenshot showing generated designs generated with a Creativity Index set in an example embodiment.
Figure 11:
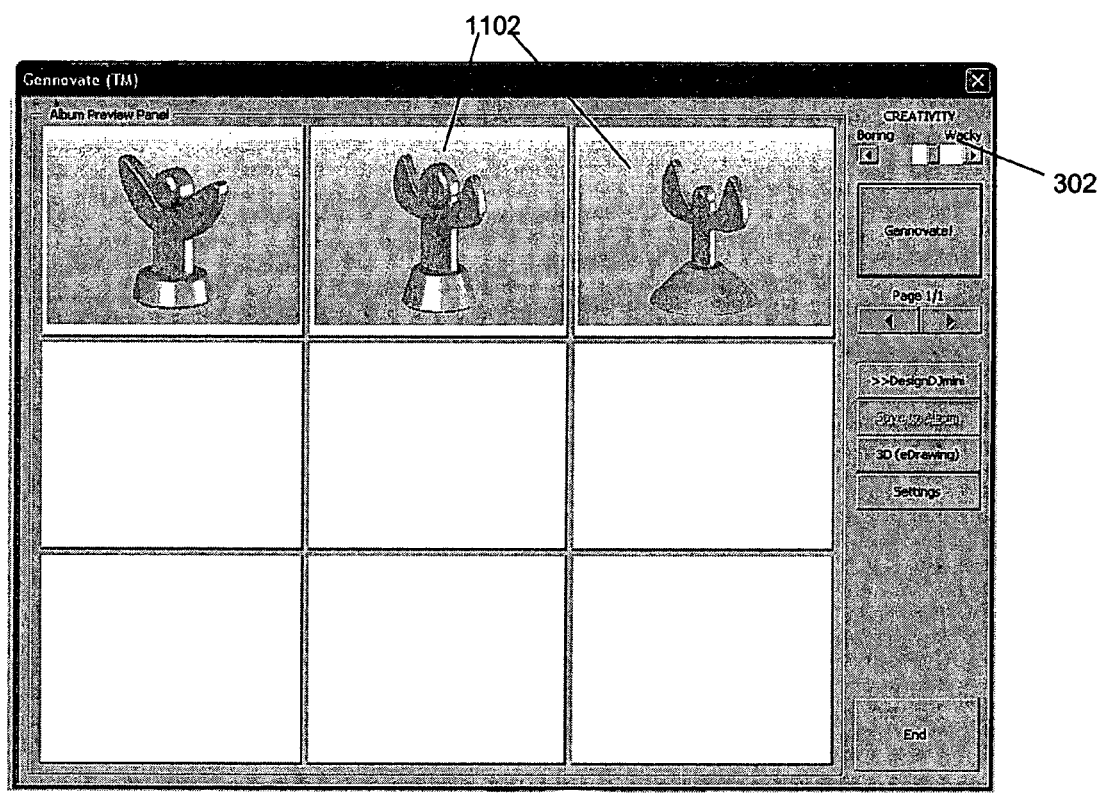
FIG. 11 is another screenshot showing generated designs generated with a Creativity Index set in an example embodiment.

FIG. 10 is a screenshot showing exemplary generated designs (e.g. 1002) generated with the Creativity Index scrollbar 302 set closer to "boring" while FIG. 11 is a screenshot showing generated designs (e.g. 1102) generated with the Creativity Index scrollbar 302 set closer to "wacky". The generated designs are varied from the original default model 400 in FIG. 4.

Figure 12:
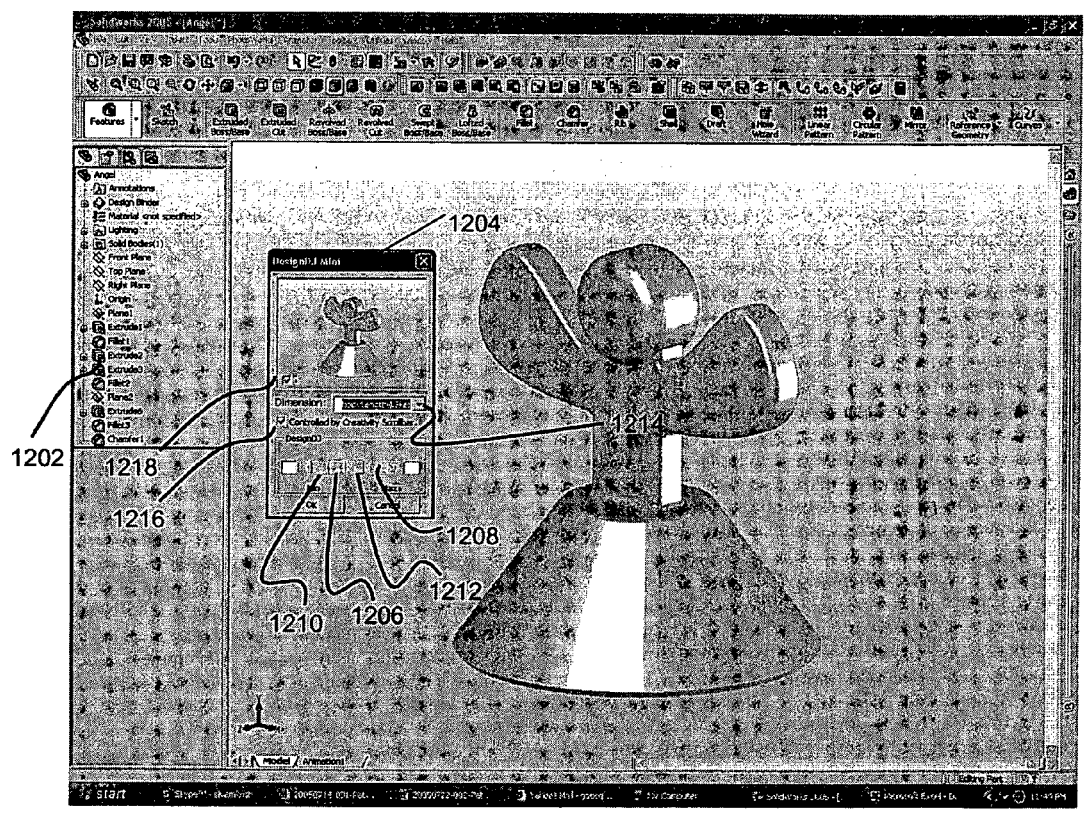
FIG. 12 is a screenshot showing live user interaction using a Computer Aided Design (CAD) package in an example embodiment.

FIG. 12 is a screenshot showing live user interaction using the CAD package in the example embodiment. The selected generated design 1200 can be further varied by modifying the design parameters (e.g. 1202) "live" using an editing window 1204. A tab 1206 can be used by the user to set the parameter default value along the scrollbar 1208. Tabs 1210 and 1212 can be used by the user to set a minimum value and a maximum value respectively along the scrollbar 1208. The "live" interaction of the user varying the parameter values using the scrollbar 1208 allows the user to visually judge the effects of setting the limits (i.e. by using the tabs 1210 and 1212). The interactive control can also be used to vary the limits during the Limit Generation stage during design generation.

A drop-down list 1214 can by used to choose each design parameter for setting the limits of the parameter, linking the limits to the Creativity Index 704 (FIG. 7) by using a toggle switch 1216, de-linking the design parameter by e.g. changing the parameter name to a default value (e.g. D1) or allowing for auto-adjustment of the parameter value by the CAD package to prevent model re-build failures. Fillets are minor geometric features that can cause a model to fail during re-building. By allowing auto-adjustment of the parameter value when fillets occur, model re-build failures can be rectified.

A toggle switch 1218 is provided for activating an interactive image rebuild of the default model 1200 within the editing window 1204. A "Gennovate" button (not shown) can be used to generate a random parameter value within the set limits so that the user can observe the variations in design that can be generated. The system illustrated in FIG. 12 can also be used to generate design options within the main CAD package feature by feature. A collection of features may be chosen by the user and design variations can be generated based on these chosen features. The default model is construed using a list of features, for example 1202. Parameters of each feature may be grouped for the ease of identification and manipulation. Most CAD packages allow the switching on and off of these features. This allows for example the exploration of design possibilities with the desired level of complexity. For example, the overall shape of a TV may be explored first—by switching off minor features such as buttons, which may be switched on at a latter stage of design exploration. The design generation program may also control the switching on and off of features.

The toggle button 1216 allows the user to set the minimum and maximum limits either using the scroll bar 1208, or, for example, using the Creativity Index set by scroll bar 302 (FIG. 3).

Figure 13:
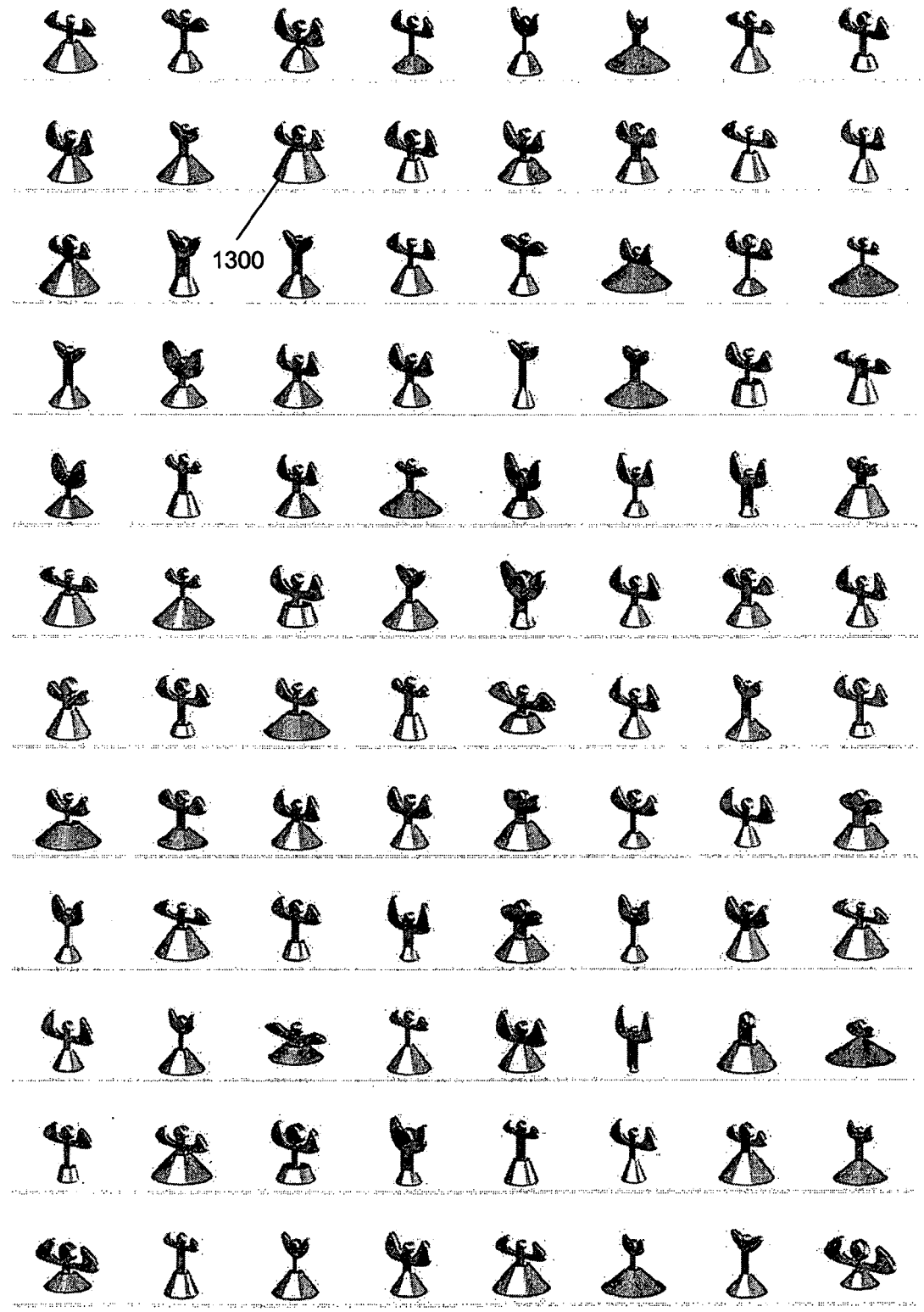
FIG. 13 is a screenshot showing designs generated based on the default model in FIG. 4, in an example embodiment.

FIG. 13 is a screenshot illustrating the large variety of designs, for example 1300, generated by the design generation program based on the default model shown in FIG. 4, in the example embodiment.

The example embodiments described approach each design problem as a parametrically driven exploration of design possibilities. In the approach of the example embodiments, data carried as the "genetic code" of the default model is not switched on in all the design representations. Certain "genes" in the early, for example, form-making stage of the design process may be switched off and the "genes" that give rise to details may be switched on as the design process progresses. As such, the design and resulting computational complexity is reduced at the early stage of design development and exploration may be carried out based on selected parameters which are relatively more important. In the example embodiments, the user can make rough form models of selected designs initially and progressively add details at later stages. The user is also allowed to explore designs first through a significantly large range of design possibilities, expanding interims of design possibilities, contracting the number of design possibilities and then expanding the number of design possibilities again, based on certain user-defined preferences at different stages of the design process. Such an approach is much closer to a way designers work, in which complexity is controlled and detail is added as the design progresses.

The example embodiments differ from typical shape grammar-based methods as the example embodiments utilize the geometric kernel of the CAD package to maintain the geometric relationships and logic of the parametric model. As such, the Parametric CAD Package 504 (FIG. 5) is used to identify the geometrically viable design region and to handle the relational issues substantially without the need to write complex relationship or grammatical rules, as required by typical shape grammar methods. The geometric engine of the Parametric CAD Package 504 is also used to validate the geometry of each prospective design variation in the example embodiments. The capabilities that are in-built in the Parametric CAD Package 504 are also exploited to build the geometric constraints in the example embodiments.

The Design Generation Program in the example embodiments can be used interactively to search broadly for design solutions e.g. by increasing the Creativity Index, by selecting some "promising" designs and by reducing the Creativity Index to explore design solutions near the initial selected "promising" solutions. In addition, certain "complex" features may be, for example, temporarily suspended to generate 3D models smaller and relatively less complicated as design features may be switched on and off by the user during the design process.

As will be appreciated by a person skilled in the art, the example embodiment thus provides a plurality of computer generated designs (e.g. 1002, 1102), based on a default model 400 (FIG. 4). Therefore, in contrast to existing computer generated or assisted design methods and systems, which either start with a "blank page" or a plurality of basic elements which make up the desired design object, or require a population of designs for breeding and mutation, it has been recognized by the inventors that a default model of the design object, i.e. one "workable" design object itself, contains a vast amount of design information based on which a multitude of computer generated designs can be created without requiring complex simulation algorithms, and at a high output rate. In other words, the example embodiment employs a paradigm of "if one wants to create new designs for an object, start with an existing or default model design for that object".

Figure 14:
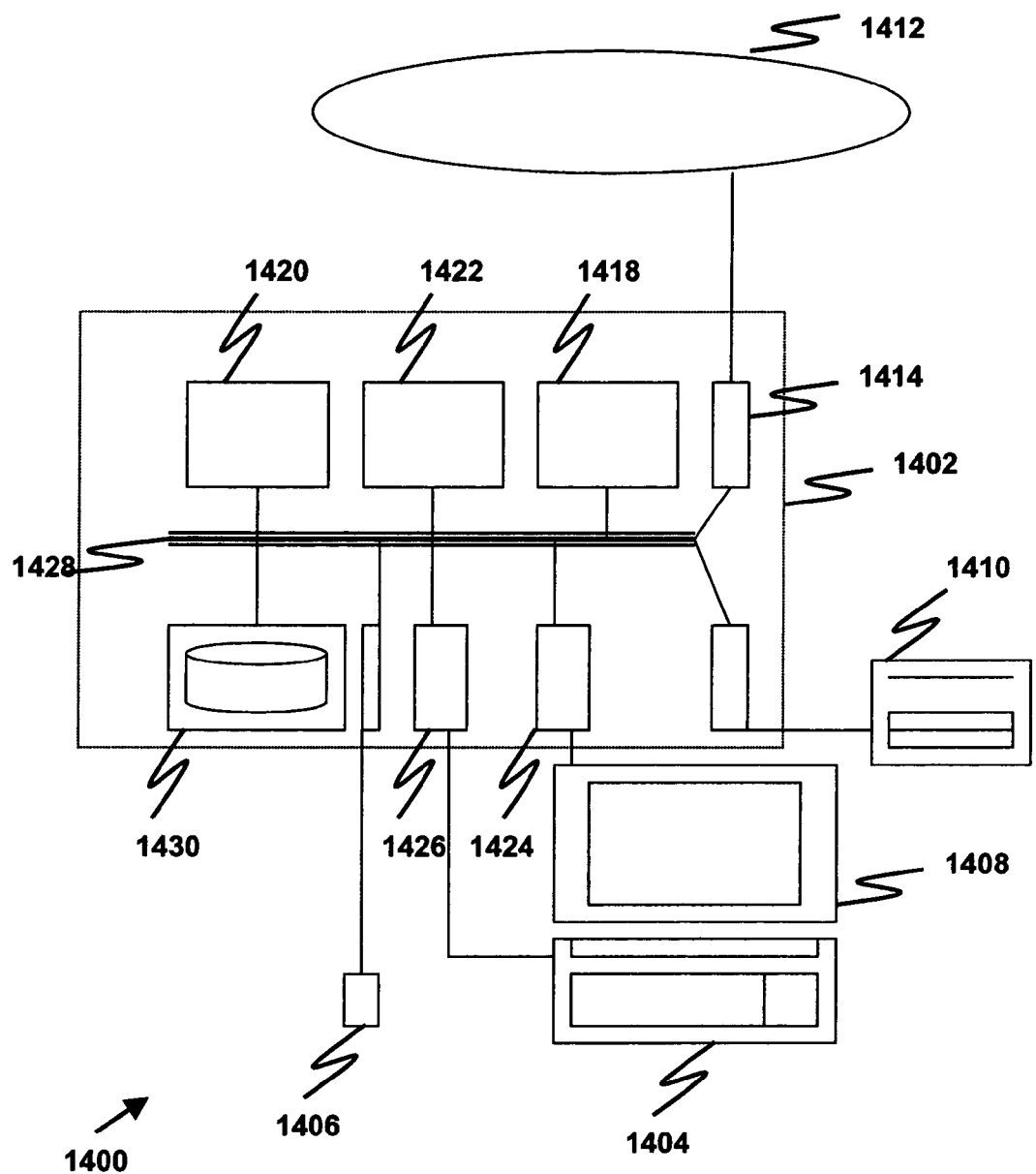
FIG. 14 shows a schematic drawing of a computer system for implementing a method of automated design of an object according to an example embodiment.

The method and system of the example embodiment can be implemented on a computer system 1400, schematically shown in FIG. 14. It may be implemented as software, such as a computer program being executed within the computer system 1400, and instructing the computer system 1400 to conduct the method of the example embodiment.

The computer system 1400 comprises a computer module 1402, input modules such as a keyboard 1404 and mouse 1406 and a plurality of output devices such as a display 1408, and printer 1410.

The computer module 1402 is connected to a computer network 1412 via a suitable transceiver device 1414, to enable access to, for example, the Internet or other network systems such as Local Area Network (LAN) or Wide Area Network (WAN).

The computer module 1402 in the example includes a processor 1418, a Random Access Memory (RAM) 1420 and a Read Only Memory (ROM) 1422. The computer module 1402 also includes a number of Input/Output (I/O) interfaces, for example I/O interface 1424 to the display 1408, and I/O interface 1426 to the keyboard 1404.

The components of the computer module 1402 typically communicate via an interconnected bus 1428 and in a manner known to the person skilled in the relevant art.

The application program is typically supplied to the user of the computer system 1400 encoded on a data storage medium such as a CD-ROM, DVD or floppy disk and read utilizing a corresponding data storage medium drive of a data storage device 1430. The application program is read and controlled in its execution by the processor 1418. Intermediate storage of program data maybe accomplished using RAM 1420.

Figure 15:
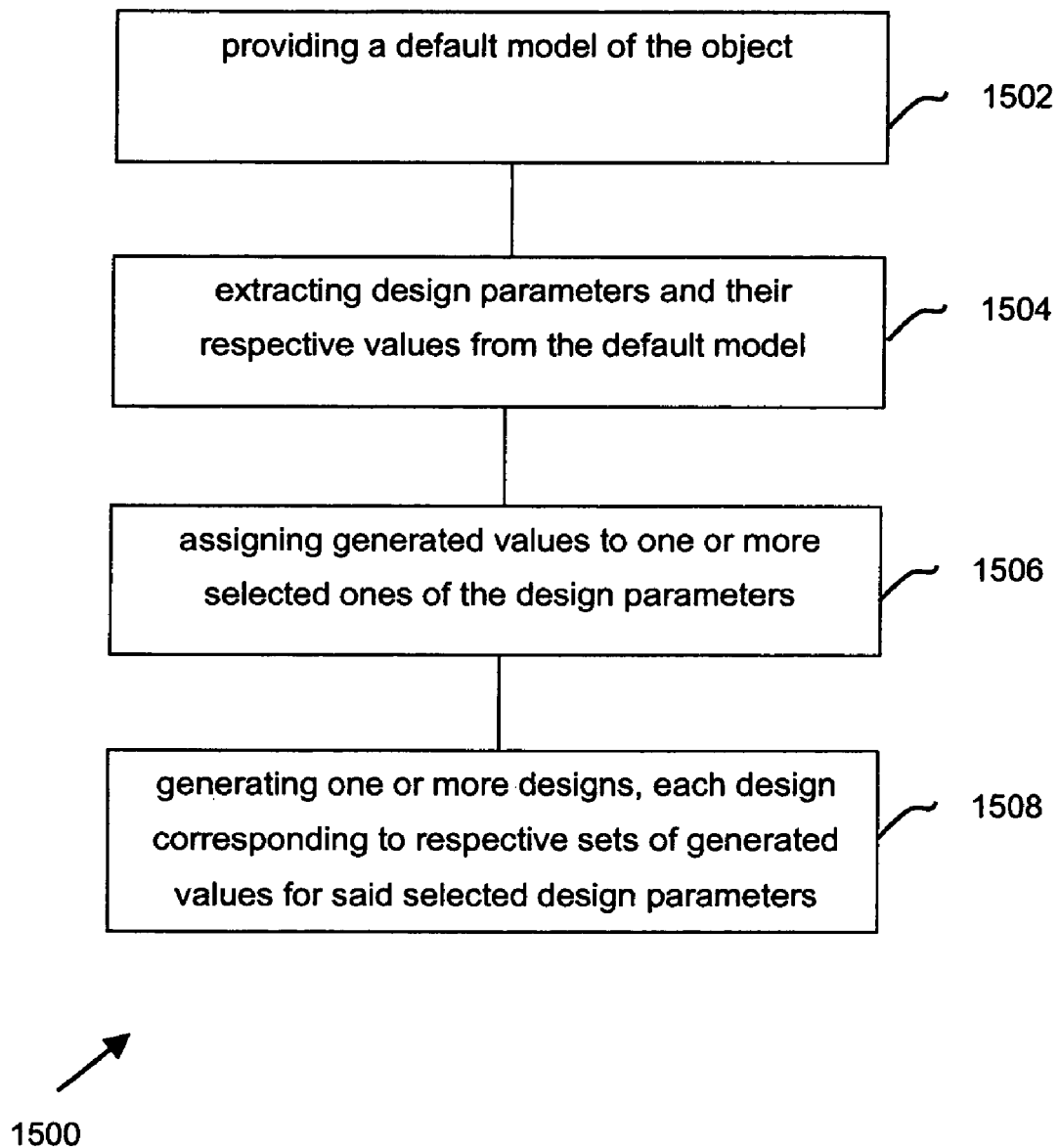
FIG. 15 shows a flow chart illustrating a method of automated design of an object according to an example embodiment.

FIG. 15 shows a flow chart 1500 illustrating a method of automated design of an object according to an example embodiment. At step 1502, a default model of the object is provided. At step 1504, design parameters and their respective values are extracted from the default model. At step 1506, generated values are assigned to one or more selected ones of the design parameters. At step 1508, one or more designs are generated, each design corresponding to respective sets of generated values for said selected design parameters.

In the example embodiments above, although all of the examples relate to part designs, the example embodiments can be applied to collection of parts or assemblies to construct, for example, a complex design.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that the present invention extends to Web applications, animation, and to two-dimensional work. In animation applications, two new parameters, sequence and timing, can be introduced as design parameters in example embodiments. Existing CAD packages may enable animation and two-dimensional work, and allow for web design, which can be readily exploited in implementation of example embodiments of the present invention.

Furthermore, it will be appreciated that the present invention may be applied to create assemblies consisting of a number of parts. The interaction of these parts can be modeled and variations explored, taking into account those interactions in example embodiments. One example would be creating and laying out a number of buildings in a given building site, where buildings need to be placed within the site based on certain interactions, such as their respective architectural styles not clashing with each other. In that regard, it will be appreciated that the present invention is not limited to design in the context of industrial design, but does extend to other creative design processes, including architecture and landscaping.

The program components of an example embodiment may reside in various computer systems connected by a network. Embodiments of the invention can allow clients to design products online. Once the geometric and other limits are identified, it would be possible to allow a client to drive the design without the risk of model failure due to geometric or other errors. By storing images of many possible configurations, it would be possible to speed up the process, where it would appear to work real time even though a program could select from the settings from storage according to the set criteria.

Records of failed attempts may also be stored to ensure the program does not try those attempts again. One may also record particular features that fail and the limits in which these failures occur, from a feature point of view.

Example embodiments of the present invention allow not only generation of design based on a default model, but mapping existing designs onto a design space. For example, one can instruct the program to avoid certain regions (as those designs may be protected, or be strongly identified to a brand). One can also instruct the design generation program to keep a certain parametric distance from existing products in the market. One may also instruct the program to explore designs around a design product (by mapping the product attributes in design space).

The previous description is of preferred embodiments for implementing the invention, and the scope of the invention should not necessarily be limited by this description. The scope of the present invention is instead defined by the following claims.

I claim:

1. A method implemented on a computing device for automated design of an object, the method comprising:
providing a default model of the object in the computing device;
extracting, using the computing device, design parameters from the default model, wherein the design parameters represent a design space;
determining, using the computing device, a first region within the design space corresponding to ranges for the design parameters based on a geometric viability of respective resulting designs;
defining, using the computing device, a second region of the design space within the first region by eliminating a portion of the first region based on one or more criteria other than geometric viability;
generating, using the computing device, one or more proposed sets of values for the design parameters such that the proposed sets of values are limited to be within the second region of the design space;
generating, using the computing device, one or more designs, based on respective ones of said generated proposed sets of values;
creating, using the computing device, respective geometric models representing the generated one or more designs; and
displaying images of the created respective geometric models on a display device.

2. The method as claims in claim 1, further comprising selecting a creativity measure, and using the creativity measure to set parameter limits for generated designs within the second region of the design space based on the selected creativity measure.

3. The method as claimed in claim 1, further comprising selecting a uniqueness measure, and filtering the generated designs based on the selected uniqueness measure.

4. The method as claimed in claim 3, wherein the uniqueness measure represents a threshold value for an absolute difference in parameters between different generated designs, and the filtering eliminates generated designs having absolute differences in parameters lower than the threshold value to at least one other generated design.

5. The method as claimed in claim 1, wherein a plurality of images of the created geometric models of the generated designs is displayed in one window.

6. The method as claimed in claim 1, wherein one image of one created geometric model of one generated design is displayed, and the method further comprises:
changing one or more values of the set of proposed values based on which said one generated design was generated, thereby changing the set of values;
generating another design, based on the changed the set of values
creating another geometric model representing the generated another design; and
displaying an image of the created another geometric model on the display device.

7. The method as claimed in claim 6, wherein said one or more values are changed within pre-defined ranges.

8. The method as claim in claim 1, wherein the generated designs are stored in a database.

9. The method as claimed in claim 8, further comprising user-input of rating values of respective one or more of the generated designs, and storing said rating value in the database.

10. The method as claimed in claim 9, wherein the rating values are used for further generation of designs.

11. The method as claimed in claim 1, wherein one or more of the design parameters are deselected from variation during generation of the one or more designs to reduce complexity when generating the one or more designs.

12. The method as claimed in claim 1, further comprising accessing a network wherein one or more users of the network provide user-inputs when generating the one or more designs.

13. The method as claimed in claim 1, wherein the criteria other than geometric viability comprise one or more of a group consisting of cost, manufacturability, engineerability, protected designs, architectural style, landscaping styles, and branded designs.

14. The method as claimed in claim 1, further comprising mapping the design space to another space representing an attribute of the object, defining a third region of said design space, and generating the one or more designs, each design corresponding to respective sets of generated values based on the third region of the design space.

15. The method as claimed in claim 14, wherein the attribute comprises one or more of a group consisting of performance, color, and volume.

16. A computing system for automated design of an object, the system comprising:
one or more processors;
a memory storing a program of instructions;
a display device;
means for extracting design parameters from a default model, wherein the design parameters represent a design space;
means for determining a first region within the design space corresponding to ranges for the design parameters based on a geometric viability of respective resulting designs;
means for defining a second region of the design space within the first region by eliminating a portion of the first region based on one or more criteria other than geometric viability;
means for generating proposed sets of values for the design parameters such that the proposed sets of values are limited to be within the second region of the design space;
means for generating one or more designs, based on respective ones of said generated proposed sets of values;
means for creating respective geometric models representing the generated one or more designs; and
means for displaying images of the created respective geometric models on the display device.

17. The computing system as claimed in claim 16, further comprising means for selecting a creativity measure, and means for using the creativity measure to set parameter limits for the generated designs within the second region of the design space based on the selected creativity measure.

18. The computing system as claimed in claim 16, further comprising means for selecting a uniqueness measure, and means for filtering the generated designs based on the selected uniqueness measure.

19. The computing system as claimed in claim 16, further comprising means for selecting one of the generated designs as a new default model.

20. The computing system as claimed in claim 16, wherein the means for displaying displays a plurality of images of the created geometric models of the generated designs is displayed in one window.

21. The computing system as claimed in claim 16, wherein the means for displaying displays one generated design, and the system further comprises:
means for changing one or more values of the set of proposed values based on which said one generated design was generated, thereby changing the set of values;
means for generating another design, based on the changed the set of values
means for creating another geometric model representing the generated another design; and
means for displaying an image of the created another geometric model on the display device.

22. The computing system as claimed in claim 21, wherein the means for changing said one or more values are changed within pre-defined ranges.

23. The computing system as claimed in claim 16, further comprising means for storing the generated designs in a database.

24. The computing system as claimed in claim 23, further comprising means for user-input of rating values of respective one or more of the generated designs, and means for storing said rating values in the database.

25. The system as claimed in claim 24, wherein the rating values are used for further generation of designs.

26. The system as claimed in claim 16, wherein the means for generating the one or more design is arranged such that design parameters are deselected from variation during generation of the one or more designs to reduce complexity when generating the one or more designs.

27. The system as claimed in claim 16, wherein the criteria other than geometric viability comprise one or more of a group consisting of cost, manufacturability, engineerability, protected designs, architectural style, landscaping styles, and branded designs.

28. The system as claimed in claim 16, further comprising means for mapping the design space to another space representing an attribute of the object, means for defining a third region of said design space, and the means for generating the one or more designs generates the one or more design corresponding to respective sets of generated values based on the third region of the design space.

29. The system as claimed in claim 28, wherein the attribute comprises one or more of a group consisting of performance, color, and volume.

30. The system as claimed in claim 16, further comprising network accessing means wherein one or more users of the network provide user-inputs when generating the one or more designs.

31. A computing system for automated design of an object, the system comprising
a processor;
a display device; and
a memory coupled to the processor, the memory, comprising program modules with program instructions executable by the processor, the program modules comprising:
a module for extracting design parameters from a default model, wherein the design parameters represent a design space;
a module for determining a first region within the design space corresponding to ranges for the design parameters based on a geometric viability of respective resulting designs and for defining a second region of the design space within the first region by eliminating a portion of the first region based on one or more criteria other than geometric viability;
a module for generating proposed sets of values for the design parameters such that the proposed sets of values are limited to be within the second region of the design space;
a module for generating one or more designs, based on respective ones of said generated proposed sets of values;
a module for creating respective geometric models representing the generated one or more designs; and
a module for displaying images of the created respective geometric models on a display device.

32. A computer readable storage medium having stored thereon computer executable instructions which when executed on a computer perform a method of automated design of an object, the method comprising:
  providing a default model of the object;
  extracting design parameters from the default model, wherein the design parameters represent a design space;
  determining a first region within the design space corresponding to ranges for the design parameters based on a geometric viability of respective resulting designs;
  defining a second region of the design space within the first region by eliminating a portion of the first region based on one or more criteria other than geometric viability;
  generating proposed sets of values for the design parameters such that the proposed sets of values are limited to be within the second region of the design space;
  generating one or more designs, based on respective ones of said generated proposed sets of values;
  creating respective geometric models representing the generated one or more designs; and
  displaying images of the created respective geometric models on a display device.

* * * * *